(12) United States Patent
Song et al.

(10) Patent No.: US 9,276,202 B2
(45) Date of Patent: Mar. 1, 2016

(54) PHASE-CHANGE STORAGE UNIT CONTAINING TISIN MATERIAL LAYER AND METHOD FOR PREPARING THE SAME

(71) Applicant: SHANGHAI INSTITUTE OF MICROSYSTEM AND INFORMATION TECHNOLOGY, CHINESE ACADEMY, Shanghai (CN)

(72) Inventors: Zhitang Song, Shanghai (CN); Yuefeng Gong, Shanghai (CN); Feng Rao, Shanghai (CN); Bo Liu, Shanghai (CN); Yong Kang, Shanghai (CN); Bangming Chen, Shanghai (CN)

(73) Assignee: SHANGHAI INSTITUTE OF MICROSYSTEM AND INFORMATION TECHNOLOGY, CHINESE ACADEMY OF SCIENCES, Changing District Shanghai (CN)

( * ) Notice: Subject to any disclaimer, the term of this patent is extended or adjusted under 35 U.S.C. 154(b) by 102 days.

(21) Appl. No.: 14/123,454

(22) PCT Filed: Dec. 27, 2012

(86) PCT No.: PCT/CN2012/087598
§ 371 (c)(1),
(2) Date: Dec. 2, 2013

(87) PCT Pub. No.: WO2014/040358
PCT Pub. Date: Mar. 20, 2014

(65) Prior Publication Data
US 2015/0221863 A1 Aug. 6, 2015

(30) Foreign Application Priority Data
Sep. 14, 2012 (CN) .......................... 2012 1 0342947

(51) Int. Cl.
*H01L 21/20* (2006.01)
*H01L 29/00* (2006.01)
*H01L 45/00* (2006.01)

(52) U.S. Cl.
CPC .............. *H01L 45/06* (2013.01); *H01L 45/126* (2013.01); *H01L 45/1226* (2013.01); *H01L 45/1233* (2013.01); *H01L 45/1253* (2013.01); *H01L 45/144* (2013.01); *H01L 45/16* (2013.01); *H01L 45/1608* (2013.01)

(58) Field of Classification Search
CPC ............................. H01L 45/14; H01L 45/141
USPC ............................................... 438/385; 257/1
See application file for complete search history.

(56) References Cited

U.S. PATENT DOCUMENTS

| | | | |
|---|---|---|---|
| 2008/0054246 A1* | 3/2008 | Sato | H01L 27/2436 257/4 |
| 2009/0219755 A1* | 9/2009 | Zaidi | G11C 13/0004 365/163 |
| 2010/0044669 A1* | 2/2010 | Happ et al. | 257/3 |
| 2010/0259961 A1* | 10/2010 | Fasoli et al. | 365/51 |
| 2012/0040508 A1* | 2/2012 | Oh et al. | 438/382 |
| 2012/0294065 A1* | 11/2012 | Hong et al. | 365/148 |

* cited by examiner

*Primary Examiner* — Caridad Everhart
(74) *Attorney, Agent, or Firm* — Tianhua Gu; Global IP Services

(57) ABSTRACT

The present invention provides a phase-change storage unit containing a TiSiN material layer and a method for preparing the same. The phase-change storage unit includes a phase-change material layer and a lower electrode located there below, the phase-change material layer and the lower electrode are connected by a TiSiN material layer, the lower electrode includes a bottom and a sheet side connected to the bottom, the sheet side is perpendicular to the bottom to form a blade structure, and the top of the sheet side contacts the TiSiN material layer. The present invention adopts annealing to increase the grain size of the electrode so as to reduce the overall resistance of the device and form a TiSiN material layer on the top of the lower electrode so as to reduce the effective operation region. The phase-change storage unit of the present invention is applied to a phase-change memory to achieve the advantages such as low power consumption, high density and high data retention performance.

12 Claims, 5 Drawing Sheets

PHASE-CHANGE STORAGE UNIT CONTAINING TISIN MATERIAL LAYER AND METHOD FOR PREPARING THE SAME

CROSS REFERENCE TO RELATED PATENT APPLICATION

The present application is the US national stage of PCT/CN2012/087598 filed on Dec. 27, 2012, which claims the priority of the Chinese patent application No. 201210342947.1 filed on Sep. 14, 2012, which application is incorporated herein by reference.

BACKGROUND OF THE PRESENT INVENTION

1. Field of Invention

The present invention belongs to the field of microelectronics technologies, and relates to a low-power consumption phase-change storage unit and a method for preparing the same, and specifically to a phase-change storage unit containing a TiSiN material layer and a method for preparing the same.

2. Description of Related Arts

The phase-change memory technology is established based on the concept that a phase-change film is applicable to a phase-change storage medium proposed by Ovshinsky during the late 60s (Phys. Rev. Lett., 21, 1450~1453, 1968) and early 70s (Appl. Phys. Lett., 18, 254~257, 1971) in the $20^{th}$ century and provides an inexpensive storage device with stable performance. A phase-change memory is capable of being fabricated on a silicon chip substrate, and the research focuses on the key materials such as recordable phase-change films, heating electrode materials, thermal insulation materials and lead-out electrode materials are carried out about the device techniques: the physical mechanism researches of devices including how to reduce device materials. The basic principle of the phase-change memory is to apply an electrical pulse signal on a device unit to cause reversible phase changes between an amorphous state and a polycrystalline state for a phase-change material, and by means of distinguishing the high resistance in the amorphous state and the low resistance in the polycrystalline state, the operations of writing, erasing and reading information are implemented.

As a phase-change memory has the advantages such as high-speed read, large number of erasable times, being non-volatile, small component size, low power consumption, resistance to strong vibrations and resistance to radiations, the International Semiconductor Industry Association believes that the phase-change memory is the device that is most likely to become the mainstream memory products in the future in place of the current flash memory and is the earliest to become commercially available products.

The read, write, erase operations on a phase-change memory are to apply, on a device unit, voltage or current pulse signals with different widths and heights: an erase operation (RESET), in which a short and strong pulse signal is applied to increase the temperature of the phase-change material in the device unit to a value above a melting temperature and fast cooling is then performed to implement the conversion of the phase-change material from a polycrystalline state into an amorphous state, namely, the conversion from state "1" into state "0"; an write operation (SET), in which a long and middle-strength pulse signal is applied to increase the temperature of the phase-change material to a value below the melting temperature and above the crystallization temperature, the temperature is kept for a period of time to urge the crystal nucleus to grow so as to implement the conversion from the amorphous state into the polycrystalline state, namely, the conversion from state "0" to state "1"; and a read operation, in which a very weak pulse signal that does not influence the state of the phase-change material is applied, the state of a device unit is read by measuring the resistance value thereof.

A lot of work has been done to reduce the power consumption of a device, including the proposal of various improved structures such as an annular electrode (Ahn, S. J. et al., Highly reliable 50 nm contact cell technology for 256 Mb PRAM, Symposium on VLSI Technology, 2005. Page 98-99), or the phase-change material and the transversal electrode size of a heating electrode are controlled within one same nanometer range; for example, phase-change nanometer points whose growth diameter and height may be controlled at about 50 nm; for example, the phase-change material is filled with electrical insulation and thermal insulation materials or is directly made into an annular phase-change material structure; for example, through the extrusion of the thermal insulating layer, the size of a region where a phase change occurs is about in the range of 2 nm to 200 nm; or the phase-change material layer is directly made into a shape in which the two ends are wider than the middle portion, and the upper and lower electrodes and alloy may be corroded through corrosive liquids with different corrosion rates; nan scale phase-change storage units in a shape of an "inverted tower" may also be fabricated, and phase-change materials and electrode materials may be filled in the inverted tower in a cavity array; or a transversal device structure may be adopted, a phase-change material is deposited on the carbon nanotube, and the transversal diameter may be controlled at 100 nm; or a thermal insulating layer with the heating layer made of a material such as $ZrO_2$, $HfO_2$, $Ta_2O_5$, $TiO_2$, or Ti may be added; the work has effectively reduced the power consumption of the operations of a device.

In the document "Phase change memory line concept for embedded memory applications" published by NXP-TSMC, a blade structure was mentioned, and also in a patent (METHOD FOR PREPARING NANOMETER HEATING ELECTRODE OF PHASE-CHANGE MEMORY) of Shanghai Institute of Microsystem and Information Technology, Chinese Academy of Sciences, the preparation by using a micrometer/nanometer processing technology was mentioned, which has implemented the method for preparing small holes on the basis of using large nanometer heating electrodes. However, in these researches, a method for silicon implantation through an ion beam was not mentioned, in which a TiN electrode is made into TiSiN, and the thickness of the TiSiN material layer is controlled by controlling the implantation amount of silicon; by means of a high-resistance transition layer of TiSiN, the effective operation region of the phase-change material is close to the electrodes, and the effective operation region is reduced; at the same time of enhancing the heating efficiency, the operating current is reduced, and especially, the operating current during the conversion from a polycrystalline state into an amorphous state is reduced, thereby implementing the high-density 1D1R integration and reducing the power consumption of a device.

In view of this, it is necessary to design a new phase-change memory unit structure with a TiSiN material to implement the low power consumption, high density and high stability of a device.

SUMMARY OF THE PRESENT INVENTION

In view of all the disadvantages in the prior art, an objective of the present invention is to provide a phase-change storage unit containing a TiSiN material layer and a method for preparing the same, so as to solve the problem in the prior art that a phase-change storage unit has high power consumption, low thermal stability, and a low phase-change speed.

To implement the above objective and other related objectives, the present invention provides a phase-change storage unit containing a TiSiN material layer and a method for preparing the same. The phase-change storage unit of the present invention is characterized by high data retention performance, a high speed, and low power consumption.

The present invention adopts the following technical solution. A phase-change storage unit comprises a phase-change material layer and a lower electrode located there below, in which the phase-change material layer and the lower electrode are connected by a TiSiN material layer.

Optionally, the lower electrode comprises a bottom and a sheet side connected to the bottom, the sheet side is perpendicular to the bottom to form a blade structure, and the top of the sheet side contacts the TiSiN material layer.

Optionally, the thickness range of the sheet side is from 5 nm to 40 nm.

Optionally, the phase-change material is any one of GeSbTe, GeTe, SbTe, AsSbTe, SbTe, GeBiTe, SnSbTe, InSbTe and GaSbTe.

Optionally, the phase-change material is $Ge_iSb_jTe_k$, in which $0<i, j$, and $k<1$; and $i+j+k=1$.

Optionally, the electrical conductivity of the TiSiN material layer is smaller than the electrical conductivity of the phase-change material.

Optionally, the thermal conductivity of the TiSiN material layer is smaller than the thermal conductivity of the phase-change material.

Optionally, the material of the lower electrode is any one of TiN, W, Ta and Pt.

The present invention further provides a method for preparing a phase-change storage unit, and the method comprises the following steps:

1) providing a substrate, the substrate comprising a metal layer and an insulating layer covering the metal layer;

2) etching the insulating layer to the metal layer, and forming an insulating groove reaching the metal layer on the substrate;

3) then depositing a heating metal material to make the heating metal material cover the surfaces of the insulating layer and the insulating groove;

4) removing a part of the heating metal material at one side inside the insulating groove; depositing a medium material, filling the insulating groove, then performing polishing to remove the heating metal material and the medium material outside the insulating groove and on the insulating layer, and forming the rest heating metal material inside the insulating groove into a lower electrode; the lower electrode comprising a bottom and a sheet side connected to the bottom to form a blade structure;

5) forming a TiSiN material layer on the top of the lower electrode;

6) depositing a phase-change material layer on the structure formed in Step 5), and then preparing an upper electrode on the phase-change material layer.

Optionally, in Step 6), after the phase-change material layer is deposited, an annealing process is further comprised.

Optionally, the material of the lower electrode is TiN, and in Step 5), a method for silicon implantation through an ion beam is performed at the top of the lower electrode to obtain a TiSiN material layer.

Optionally, the material of the lower electrode is any one of TiN, W, Ta and Pt, and in Step 5), a coating technique is adopted to form a TiSiN material layer on the top of the lower electrode.

Optionally, the phase-change material layer is a mushroom type, a limiting type or a linear type.

As discussed above, the phase-change storage unit containing a TiSiN material layer and the method for preparing the same of the present invention have the following beneficial effects: first, on the basis of the compatibility with the complementary metal-oxide-semiconductor (CMOS) technique, the grain size of an electrode is increased through annealing to increase the electrical conductivity of the electrode, and also the contact resistances between all interfaces are reduced, so that the overall device resistance is reduced; secondly, a TiSiN material layer is formed on the top of a bottom electrode, and the thickness of the TiSiN material layer is controlled by controlling the implantation amount of silicon; by means of the high-resistance transition layer of TiSiN, the effective operation region of the phase-change material is close to the electrode, and the effective operation region is reduced; at the same time of enhancing the heating efficiency, the operating current is reduced, and especially, the operating current during the conversion from a polycrystalline state into an amorphous state is reduced, which is very helpful for implementing high-density 1D1R integration and reducing device power-consumption; thirdly, the reduction of the effective operation region reduces the power consumption and also reduces the crosstalks on the nearby storage units from the device operations, thereby enhancing the device density; fourthly, the reduction of the effective operation region reduces the power consumption and reduces the degree of component segregation caused by the conversion from a polycrystalline state into an amorphous state, thereby effectively increasing the yield of the device and the number of read and write times; fifthly, the optimized structure of the electrode is not only applicable to an existing mushroom type phase-change material layer structure but also applicable to a limiting type optimized structure and a linear structure.

LIST OF REFERENCE NUMERALS

Figure 1:
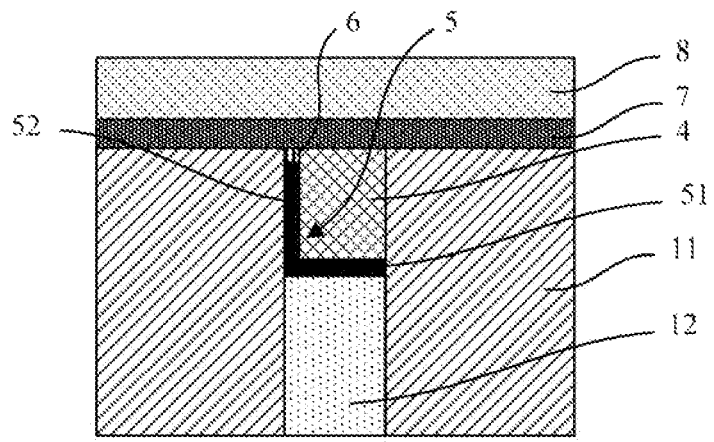
FIG. 1 is a schematic sectional view in the bit line direction of a phase-change storage unit consistent with the present invention.

1 Substrate
11 Insulating layer
12 Metal layer
2 Insulating groove
3 Heating metal material
4 Medium material
5 Lower electrode
51 Bottom
52 Sheet side
6 TiSiN material layer
7 Phase-change material layer
8 Upper electrode
9 Effective operation region

DETAILED DESCRIPTION OF THE PREFERRED EMBODIMENTS

The embodiments of the present invention are described in the following through specific examples, and those with ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

Please refer to FIG. 1 to FIG. 15. It should be noted that the drawings provided in these embodiments are only used to illustrate the basic concepts of the present invention. In the drawings, only relevant components in the present invention are shown, and the drawings are not drawn in accordance with the numbers, shapes and sizes of components during practical implementations. The forms, numbers, and proportions of components during practical implementation can be changed at will and the layout of the components might also be more complicated.

Embodiments

Figure 2:
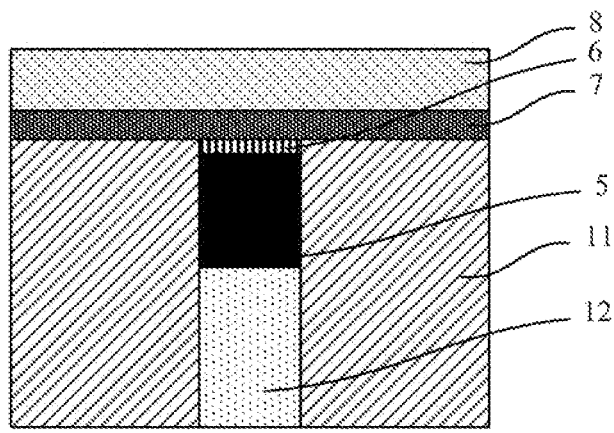
FIG. 2 is a schematic sectional view in the word line direction of a phase-change storage unit consistent with the present invention.

FIG. 1 is a schematic sectional view in the word line direction in a phase-change storage unit containing a TiSiN material layer consistent with the present invention. As shown in FIG. 1, the present invention provides a phase-change storage unit, which includes a phase-change material layer 7 and a lower electrode 5 located there below, and the phase-change material layer 7 and the lower electrode 5 are connected by a TiSiN material layer 6. The phase-change storage unit further includes a metal layer 12 located below the lower electrode 5 and contacting the lower electrode 5 and an upper electrode located above the phase-change material layer 7 and contacting the phase-change material layer 7. The peripheries of the metal layer 12, the lower electrode 5 and the TiSiN material layer 6 are filled with an insulating layer 11 and a medium material 4. FIG. 2 is a schematic sectional view in the word line direction of a phase-change storage unit consistent with the present invention.

Specifically, the lower electrode 5 includes a bottom 51 and a sheet side 52 connected to the bottom, the sheet side 52 is perpendicular to the bottom 51 to form a blade structure, and the top of the sheet side contacts the TiSiN material layer 7. The material of the metal layer 12 is W, TiN, Ta, Pt or other metal materials, and in this embodiment, the metal layer 12 is preferably a W plug. The thickness range of the sheet side 52 of the lower electrode 5 is from 5 nm to 40 nm, and in this implementation, the thickness is preferably 10 nm. The phase-change material is any one of GeSbTe, GeTe, SbTe, AsSbTe, SbTe, GeBiTe, SnSbTe, InSbTe and GaSbTe, and in this example, the phase-change material is preferably $Ge_iSb_jTe_k$, in which $0<i, j,$ and $k<1$; and $i+j+k=1$. The electrical conductivity of the TiSiN material layer 7 is smaller than the electrical conductivity of the phase-change material. The thermal conductivity of the TiSiN material layer 7 is smaller than the thermal conductivity of the phase-change material. The material of the lower electrode 5 is TiN, W, Ta, Pt or other good conductors.

Figure 3:
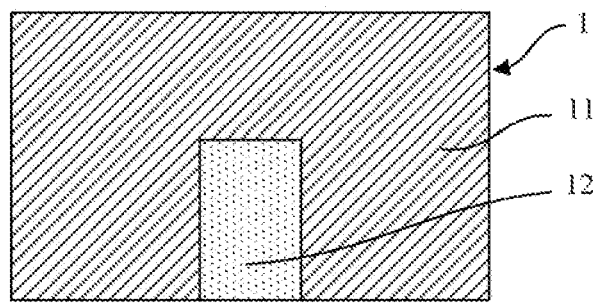
FIG. 3 is a schematic sectional view of a substrate in a method for preparing a phase-change storage unit consistent with the present invention.

The present invention further provides a method for preparing a phase-change storage unit, and the method includes the following steps:

Step 1: As shown in FIG. 3, provide a substrate 1, the substrate including a metal layer 12 and an insulating layer 11 covering the metal layer 12. Specifically, the material of the metal layer 12 is W, TiN, Ta, Pt or other metal materials, and in this embodiment, the metal layer 12 is preferably a W plug.

Figure 4:
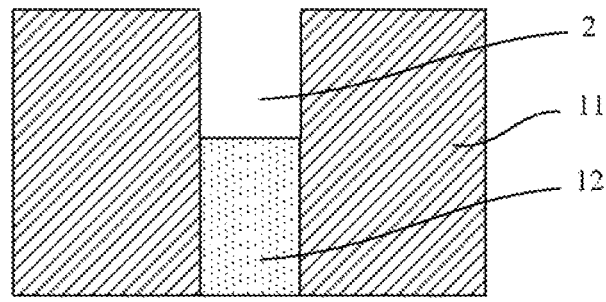
FIG. 4 is a schematic structural view presented in Step 2 in a method for preparing a phase-change storage unit consistent with the present invention.

Step 2: As shown in FIG. 4, etch the insulating layer 11 by adopting an electron beam etching technology or other etching technologies until reaching the metal layer 12, and form, on the substrate 1, an insulating groove 2 reaching the metal layer 12.

Specifically, the shape of the insulating groove 2 is, but is not limited to, a rectangle. In this embodiment, the size of the rectangular insulating groove is 60 nm×60 nm.

Figure 5:
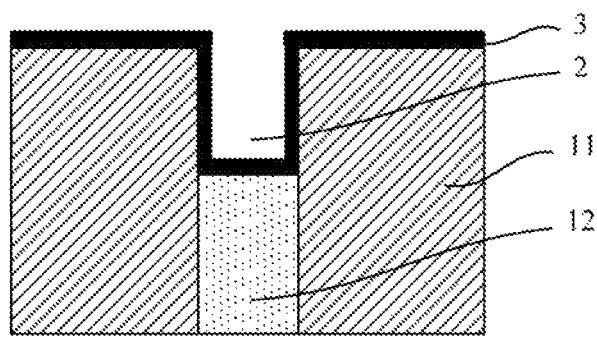
FIG. 5 is a schematic structural view presented in Step 3 in a method for preparing a phase-change storage unit consistent with the present invention.

Step 3: As shown in FIG. 5, deposit a heating metal material 3 by adopting a physical vapor deposition (PVD), atomic layer deposition (ALD) or chemical vapor deposition (CVD) method to make the heating metal material cover the surfaces of the insulating layer 11 and the insulating groove 2.

Figure 6:
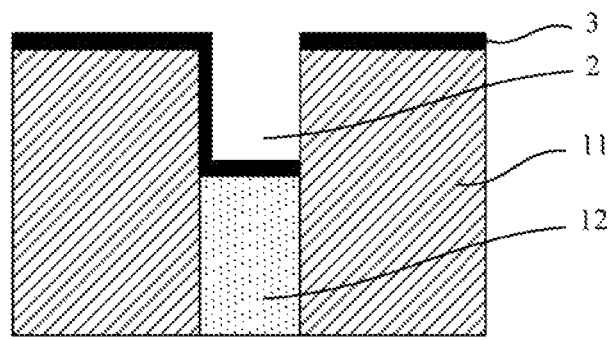
FIG. 6 to FIG. 8 are schematic structural views presented in Step 4 in a method for preparing a phase-change storage unit consistent with the present invention.
Figure 7:
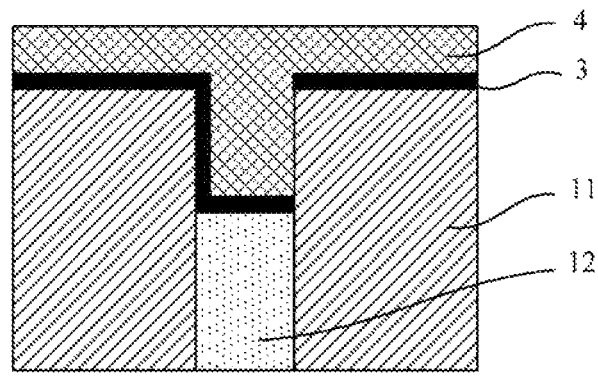
Figure 8:
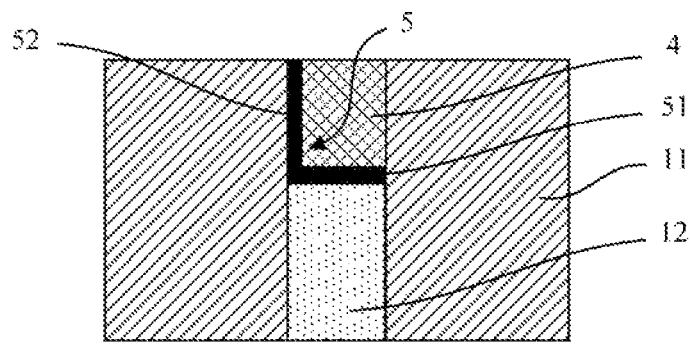

Step 4: Referring to FIG. 6 to FIG. 8, as shown in FIG. 6, remove a part of the heating metal material 3 at one side inside the insulating groove 2 by adopting photoresist coating, photolithography, development, etching, and photoresist removal operations; as shown in FIG. 7, deposit a medium material 4 by adopting an ALD or CVD method, and fill the insulating groove 2; as shown in FIG. 8, then remove the heating metal material 3 and the medium material 4 outside the insulating groove 2 and on the insulating layer 11 by adopting a chemical-mechanical polishing (CMP) or other polishing techniques, and form the rest heating metal material inside the insulating groove 2 into a lower electrode 5.

Specifically, the lower electrode 5 includes a bottom 51 and a sheet side 52 connected to the bottom and the sheet side 52 is perpendicular to the bottom 51 to form a blade structure. The material of the lower electrode is TiN, W, Ta, Pt or other good conductors. The thickness range of the sheet side 52 of the lower electrode 5 is from 5 nm to 40 nm, and in this implementation, the thickness of the sheet side 52 is preferably 10 nm.

Figure 9:
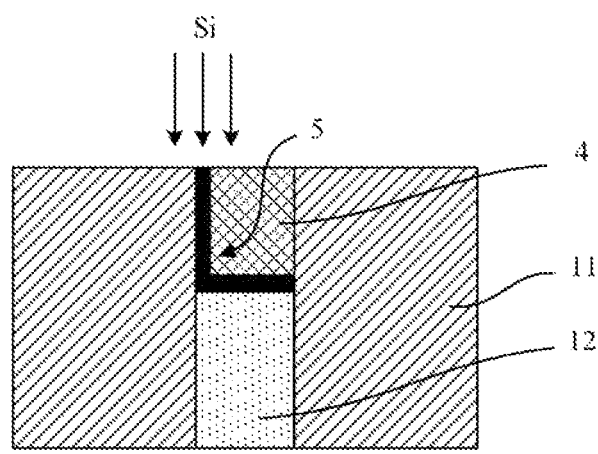
FIG. 9 and FIG. 10 are schematic structural views presented in Step 5 in a method for preparing a phase-change storage unit consistent with the present invention.
Figure 10:
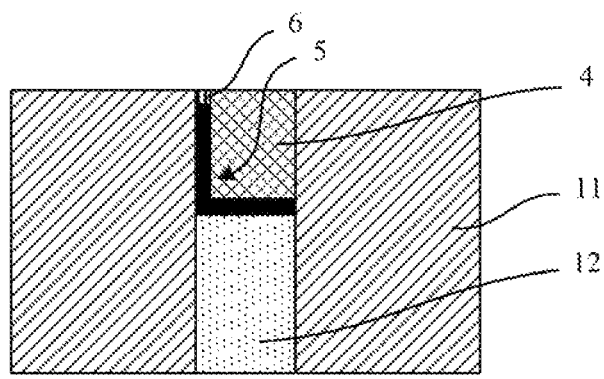

Step 5: Referring to FIG. 9 and FIG. 10, as shown in FIG. 10, form a TiSiN material layer 6 on the top of the lower electrode 5. In this embodiment, the material of the lower electrode 5 is TiN, silicon implantation through an ion beam is performed on the top thereof to form a TiSiN material layer 6. Specifically, the thickness of the TiSiN material layer 6 is controlled by controlling the implantation amount of silicon. In another embodiment, the material of the lower electrode is TiN, W, Ta, Pt or other good conductors, and a TiSiN material layer 6 is formed on the top of the lower electrode by adopting a coating technique such as ALD, PVD, or CVD. Due to the high resistivity of the TiSiN material layer 6, the effective operation region of the phase-change material is close to the lower electrode, and the effective operation region is reduced.

Figure 11:
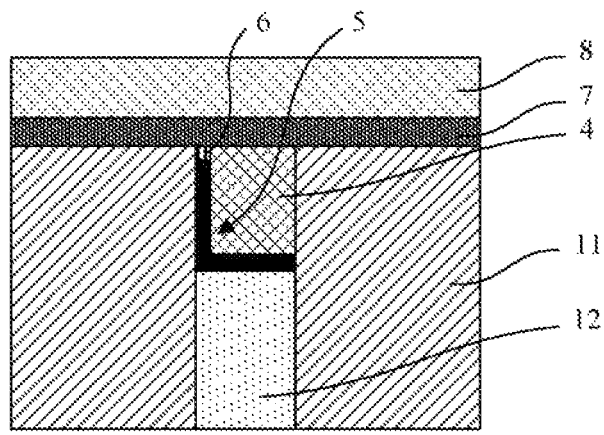
FIG. 11 is a schematic structural view presented in Step 6 in a method for preparing a phase-change storage unit consistent with the present invention.

Step 6: As shown in FIG. 11, deposit a phase-change material layer 7 on the structure formed in Step 5 by adopting a PVD, ALD or CVD method, and then prepare an upper electrode 8 on the phase-change material layer 7 by adopting a PVD, ALD or CVD method.

Specifically, after the phase-change material layer 7 is deposited, an annealing process is further included. The annealing temperature is between 200° C. and 400° C. and the annealing duration is 2 minutes to 5 minutes. The annealing is capable of increasing the grain size of the lower electrode, so as to increase the electrical conductivity thereof, and at the same time reduce the contact resistances between all interfaces, thereby reducing the overall resistance of the device.

Specifically, the phase-change material is any one of GeSbTe, GeTe, SbTe, AsSbTe, SbTe, GeBiTe, SnSbTe, InSbTe and GaSbTe, and in this embodiment, the phase-change material is preferably $Ge_iSb_jTe_k$, in which $0<i$, j, and $k<1$; and $i+j+k=1$. The electrical conductivity of the TiSiN material layer 7 is smaller than the electrical conductivity of the phase-change material. The thermal conductivity of the TiSiN material layer 7 is smaller than the thermal conductivity of the phase-change material.

Figure 12:
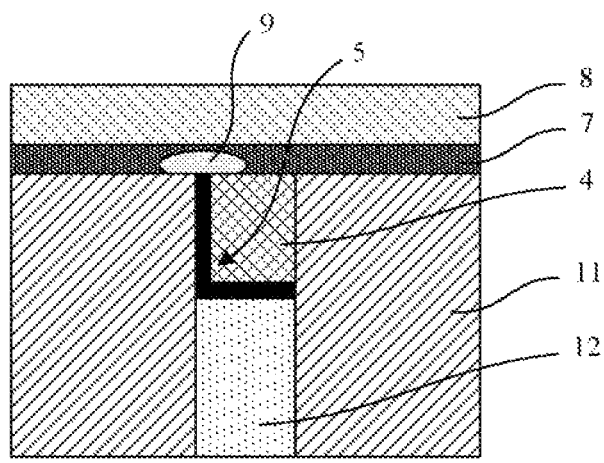
FIG. 12 shows an effective operation region during a RESET operation on a phase-change storage unit not containing a TiSiN material layer.
Figure 13:
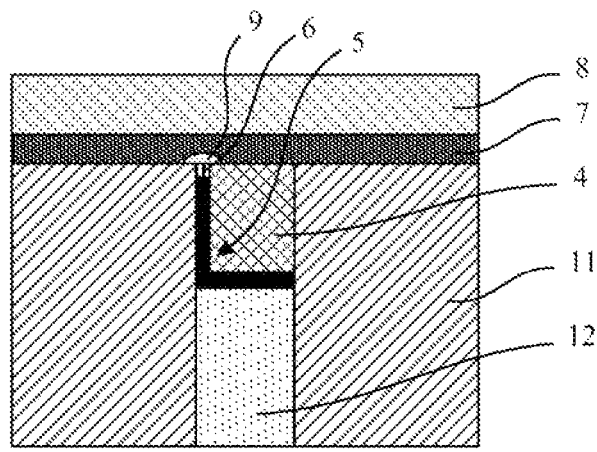
FIG. 13 shows an effective operation region during a RESET operation on a phase-change storage unit containing a TiSiN material layer consistent with the present invention.

Referring to FIG. 12 and FIG. 13, FIG. 12 shows an effective operation region during a RESET operation on a phase-change storage unit not containing a TiSiN material layer. FIG. 13 shows an effective operation region during a RESET operation on a phase-change storage unit containing a TiSiN material layer consistent with the present invention. Through the high-resistance transition layer of TiSiN, the effective operation region of the phase-change material is close to the electrode, and the effective operation region is reduced; at the same time of increasing the heating efficiency, the operating current is reduced, and especially, the operating current used during the conversion from a polycrystalline state into an amorphous state is reduced. The reduction of the effective operation region not only reduces the power consumption but also reduces the crosstalks on nearby storage units from device operations, thereby increasing the device density, further reducing the degree of component segregation caused by the conversion from a polycrystalline state into an amorphous state, and effectively enhancing the device yield and the number of read and write times.

Figure 14:
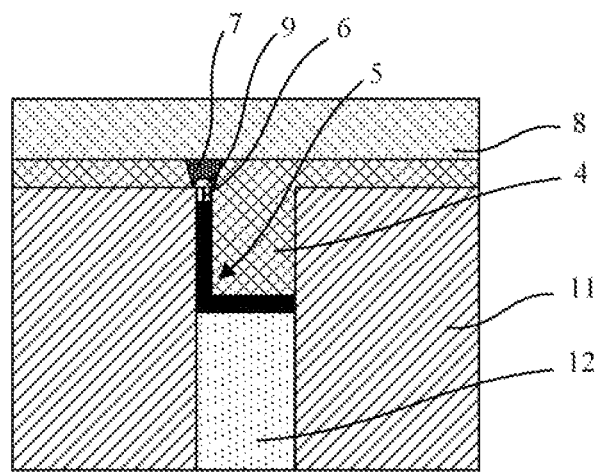
FIG. 14 is a schematic sectional view obtained when a phase-change material layer is a limiting type structure of a phase-change storage unit consistent with the present invention.
Figure 15:
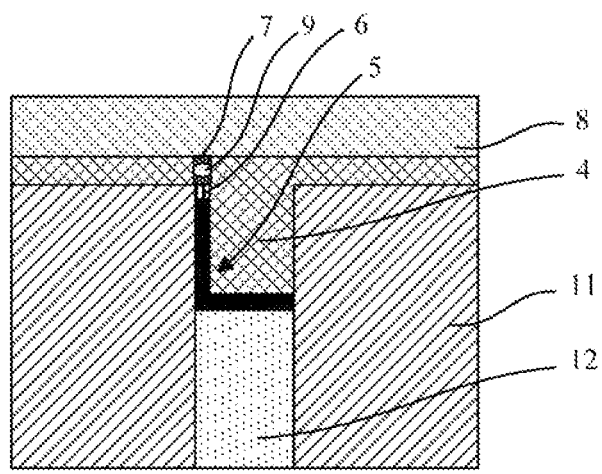
FIG. 15 is a schematic sectional view obtained when a phase-change material layer is a linear type structure of a phase-change storage unit consistent with the present invention.

In this embodiment, the phase-change material layer 7 is a conventional mushroom structure, and in other embodiments, the phase-change material layer 7 is a limiting type (as shown in FIG. 14) or a linear type (as shown in FIG. 15). The method for preparing the same is a technology well known in this field and is no longer described here. In FIG. 14 and FIG. 15, the effective operation regions of a phase-change storage unit in the limiting structure and a phase-change storage unit in the linear type structure during a RESET operation are illustrated.

In conclusion, for the phase-change storage unit containing a TiSiN material layer and the method for preparing the same of the present invention, the grain size of an electrode is increased through annealing to increase the electrical conductivity thereof and at the same time the contact resistances between all interfaces are reduced, thereby reducing the overall resistance of the device; through a high-resistance transition layer of TiSiN, the effective operation region of the phase-change material is close to the electrode, and the effective operation region is reduced; at the same time of increasing the heating efficiency, the operating current is reduced, and especially, the operating current during the conversion from a polycrystalline state into an amorphous state is reduced. The phase-change storage unit containing a TiSiN material layer of the present invention is applied to a phase-change memory, is characterized by low power consumption, high density and high stability, and is a nonvolatile semiconductor memory capable of implementing the functions of writing, erasing and reading information. Therefore, the present invention effectively overcomes the various disadvantages in the prior art and has high industrial utilization value.

The foregoing embodiments are only illustrative description of the principles and effects of the present invention rather than to limit the present invention. Variations and changes to the embodiments disclosed herein can be made by persons skilled in the art without departing from the spirit and scope of the present invention. Therefore, all variations or changes made by persons of ordinary skills in the technical field without departing from the spirit and technical concept of the present invention shall still fall within the claims of the present invention.

What is claimed is:

1. A phase-change storage unit containing a TiSiN material layer, comprising a phase-change material layer and a lower electrode located there below, wherein the phase-change material layer and the lower electrode are connected by a TiSiN material layer,
wherein the electrical conductivity of the TiSiN material layer is smaller than the electrical conductivity of the phase-change material.

2. The phase-change storage unit containing a TiSiN material layer as in claim 1, wherein the phase-change material is any one of GeSbTe, GeTe, SbTe, AsSbTe, SbTe, GeBiTe, SnSbTe, InSbTe and GaSbTe.

3. The phase-change storage unit containing a TiSiN material layer as in claim 1, wherein the phase-change material is $Ge_iSb_jTe_k$, wherein $0<i$, j, and $k<1$; and $i+j+k=1$.

4. The phase-change storage unit containing a TiSiN material layer as in claim 1, wherein the thermal conductivity of the TiSiN material layer is smaller than the thermal conductivity of the phase-change material.

5. The phase-change storage unit containing a TiSiN material layer as in claim 1, wherein the material of the lower electrode is any one of TiN, W, Ta and Pt.

6. The phase-change storage unit containing a TiSiN material layer as in claim 1, wherein the lower electrode comprises a bottom and a sheet side connected to the bottom, the sheet side is perpendicular to the bottom to form a blade structure, and the top of the sheet side contacts the TiSiN material layer.

7. The phase-change storage unit containing a TiSiN material layer as in claim 6, wherein the thickness range of the sheet side is from 5 nm to 40 nm.

8. A method for preparing a phase-change storage unit containing a TiSiN material layer, wherein the method comprises the following steps:

a) providing a substrate, the substrate comprising a metal layer and an insulating layer covering the metal layer;
b) etching the insulating layer until reaching the metal layer, and forming an insulating groove reaching the metal layer on the substrate;
c) then depositing a heating metal material to make the heating metal material cover the surfaces of the insulating layer and the insulating groove;
d) removing a part of the heating metal material at one side inside the insulating groove; depositing a medium material, filling the insulating groove, then performing polishing to remove the heating metal material and the medium material outside the insulating groove and on the insulating layer, and forming the rest of heating metal material inside the insulating groove into a lower electrode; the lower electrode comprising a bottom and a sheet side connected to the bottom to form a blade structure;
e) forming a TiSiN material layer on the top of the lower electrode;
f) depositing a phase-change material layer on the structure formed in Step 5), and then preparing an upper electrode on the phase-change material layer.

9. The method for preparing a phase-change storage unit containing a TiSiN material layer as in claim 8, wherein after the phase-change material layer is deposited in Step 6), an annealing process is further comprised.

10. The method for preparing a phase-change storage unit containing a TiSiN material layer as in claim 8, wherein the material of the lower electrode is TiN, and in Step 5), a method for silicon implantation through an ion beam is performed on the top of the lower electrode to obtain a TiSiN material layer.

11. The method for preparing a phase-change storage unit containing a TiSiN material layer as in claim 8, wherein the material of the lower electrode is any one of TiN, W, Ta and Pt, and in Step 5), a coating technique is adopted to form a TiSiN material layer on the top of the lower electrode.

12. The method for preparing a phase-change storage unit containing a TiSiN material layer as in claim 8, wherein the phase-change material layer is a mushroom type, a limiting type or a linear type.

* * * * *